(12) United States Patent
Wu

(10) Patent No.: US 6,429,797 B1
(45) Date of Patent: Aug. 6, 2002

(54) DECIMATION FILTER FOR A BANDPASS DELTA-SIGMA ADC

(75) Inventor: Miaochen Wu, Acton, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/899,610

(22) Filed: Jul. 5, 2001

(51) Int. Cl.[7] .............................. H03M 3/00; H03M 1/12
(52) U.S. Cl. ......................... 341/143; 341/155; 375/350
(58) Field of Search .................................. 341/155, 143; 327/105, 107, 113, 116; 375/350, 322, 346

(56) References Cited

U.S. PATENT DOCUMENTS

| | | | |
|---|---|---|---|
| 4,857,928 A | 8/1989 | Gailus et al. | |
| 5,150,120 A | 9/1992 | Yunus | |
| 5,181,032 A | 1/1993 | Ribner | |
| 5,196,852 A | 3/1993 | Galton | |
| 5,283,578 A | 2/1994 | Ribner et al. | |
| 5,341,136 A | 8/1994 | Przybysz et al. | |
| 5,363,101 A | 11/1994 | Ueki | |
| 5,375,146 A | 12/1994 | Chalmers | |
| 5,442,353 A * | 8/1995 | Jackson | 341/143 |
| 5,454,007 A * | 9/1995 | Dutta | 375/322 |
| 5,534,827 A | 7/1996 | Yamaji | |
| 5,557,642 A | 9/1996 | Williams | |
| 5,585,801 A | 12/1996 | Thurston | |
| 5,652,585 A | 7/1997 | Leung et al. | |
| 5,696,708 A | 12/1997 | Leung | |
| 5,714,916 A | 2/1998 | Yamaji | |
| 5,719,573 A | 2/1998 | Leung et al. | |
| 5,729,230 A | 3/1998 | Jensen et al. | |
| 5,732,337 A | 3/1998 | Wargnier et al. | |
| 5,757,867 A * | 5/1998 | Caulfield et al. | 341/143 |
| 5,767,750 A | 6/1998 | Yamaji | |
| 5,768,315 A | 6/1998 | Mittel et al. | |
| 5,777,909 A | 7/1998 | Leung et al. | |
| 5,777,912 A | 7/1998 | Leung et al. | |
| 5,786,778 A | 7/1998 | Adams et al. | |
| 5,787,125 A | 7/1998 | Mittel | |
| 5,835,044 A | 11/1998 | Nishino | |
| 5,838,272 A | 11/1998 | Steiner et al. | |
| 5,870,048 A | 2/1999 | Kuo et al. | |
| 5,917,440 A | 6/1999 | Khoury | |
| 5,952,947 A | 9/1999 | Nussbaum et al. | |
| 5,982,315 A | 11/1999 | Bazarjani et al. | |
| 6,225,928 B1 * | 5/2001 | Green | 341/143 |
| 6,243,430 B1 * | 6/2001 | Mathe | 375/346 |

OTHER PUBLICATIONS

Wu, Miaochen, "Digital Cosine And Sine Multiplication Circuits", Pending Patent Application, Ser. No. 09/484,358, filed Jan. 18, 2000.

Schreier, R., and Snelgrove, W.M., "Decimation for Bandpass Sigma–Delta Analog–to–Digital Conversion," IEEE, 1990, pp. 1801–1804.

(List continued on next page.)

*Primary Examiner*—Peguy JeanPierre
*Assistant Examiner*—Jean Bruner Jeanglaude
(74) *Attorney, Agent, or Firm*—Connolly Bove Lodge & Hutz LLP

(57) ABSTRACT

A bandpass delta-sigma modulator converts a signal of a nominal frequency to an oversampled digital signal. Digital decimation filter decimates the signal by multiplying the signal by first and second modulating signals. The modulating signals are selected to have a frequency which can produce a baseband signal with a nominal frequency of $\pi*/3$. By using an oversampling rate of 6 times the carrier frequency signal rate, the modulation signal of a frequency $\pi*/3$ produces a real and imaginary signal. The real and imaginary signal can be filtered in first and second filtering decimation circuits reducing the number of signal processing paths for the signal. The decimated signal is further filtered and decimated using conventional digital filtering techniques.

12 Claims, 1 Drawing Sheet

OTHER PUBLICATIONS

Jantzi, S.A., et al., "A Fourth–Order Bandpass Sigma–Delta Modulator," *IEEE Journal of Solid–State Circuits*, vol. 28, No. 3, Mar. 1993, pp. 282–291.

Longo, L., and Horng, B–R., "A 15b 30kHz Bandpass Sigma–Delta Modulator," *ISCC93/Session 14/Oversampled Converters/Paper FA 14.1*, 1993 IEE International Solid State Circuits Conference, pp. 226–227.

Dressler, H–J., "Interpolative Bandpass A/D Conversion—Experimental Results," *Electronics Letters*, Sep. 27, 1990, vol. 26, No. 20, pp. 1652–1653.

Singor, F.W., and Snelgrove, W.M., "Switched–Capacitor Bandpass Delta–Sigma A/D Modulation at 10.7 MHz, " *IEEE Journal of Solid–State Circuits*, vol. 30, No. 3, Mar. 1995, pp. 184–192.

Gao, W., and Snelgrove, W.M., "A 950MHz Second–Order Integrated LC Bandpass Delta–Sigma Modulator," *IEEE Journal of Solid–State Circuits*, vol. 33, No. 5, May 1998, pp. 723–732.

King, E., et al., "Parallel Delta–Sigma A/D Conversion," *Proceedings of the IEEE 1994 Custom Integrated Circuits Conference*, May 1–4, 1994, pp. 503–506.

Eshraghi, A., and Fiez, T., "A Comparison of Three Parallel /spl Delta//spl Sigma/ A/D Converters," *Connecting the World, 1996 IEEE International Symposium on Circuits and Systems*, vol. 1, 1996, pp. 517–520.

Comino, V., and Lu, A.C., "A Bandpass Sigma–Delta Modulator IC with Digital Branch–Mismatch Correction," *Proceedings of the IEEE 1999 Custom Integrated Circuits*, May 16–19, 1999, pp. 129–132.

Galton, I., and Jensen, H.T., "Oversampling Parallel Delta–Sigma Modulator A/D Conversion," *IEEE Transactions on Circuits and Systems II: Analog and Digital Signal Processing*, vol. 43, No. 12, Dec. 1996, pp. 801–810.

Farag, E.N., et al., "A Novel Parallel Architecture for a Switched–Capacitor Bandpass Sigma–Delta Modulator," *Proceedings of the 40$^{th}$ Midwest Symposium on Circuits and Systems*, vol. 1, Aug. 3–6, 1997, pp. 9–12.

Samori, C., Baschirotto, A., and Liberali, V., "Two–path structure for high performance sigma–delta modulators," *Electronics Letters*, Sep. 14, 1995, vol. 31, Issue 19, pp. 1624–1625.

\* cited by examiner

DECIMATION FILTER FOR A BANDPASS DELTA-SIGMA ADC

RELATED APPLICATIONS

This application is related to U.S. patent application Ser. No. 09/484,358, filed Jan. 18, 2000, IBM Docket FIS990225US1. The title of the application is DIGITAL COSINE AND SINE MULTIPLICATION CIRCUITS.

BACKGROUND OF THE INVENTION

The present invention relates to radio frequency signal communication systems. Specifically, a filter structure is disclosed for use in direct analog to digital conversion of a radio frequency signal which also decimates the recovered digital signal.

In wireless communication such as cellular telephones base station transceivers, it is possible to directly convert a received radio frequency signal from an analog signal to a multi-bit digital signal. In carrying out the conversion process, a delta-sigma analog to digital converter oversamples the incoming radio frequency signal to provide a high-speed oversampled digital bit stream. The high-speed (oversampled) bit stream is further filtered in a narrow band digital low pass, or a band pass, decimation filter which decimates the high-speed oversampled digital signal to generate a multi-bit low noise, nyquist rate digital signal.

Using the sigma-delta analog to digital converter, it is possible to shape the noise so that the noise is minimized about the carrier frequency of the radio frequency signal $F_c$ which is being converted to a digital signal. The sigma-delta analog to digital conversion process provides oversampling at an oversampling rate $F_s$, which is N times higher than the carrier frequency signal $F_c$ being received. The sampling frequency is also set to be higher than two times the bandwidth (BW) of the signal which is being converted to a digital signal. Accordingly, $F_s = N \times F_c$ and OSR (Oversampling Rate)$=F_s/2 \times$Bw.

The foregoing process of creating a high speed oversampled bit stream, and filtering and decimating the high bit filter stream to provide a nyquist rate digital signal requires significantly complex hardware.

As an approach to reducing the hardware requirements, Schreier and Snellgrove have proposed, in the paper, "Decimation for Bandpass Sigma-Delta Analog to Digital Conversion", *IEEE International Symposium on Circuits and Systems*, 1990, pgs. 1801–1804, a system which can provide decimation for a bandpass sigma-delta analog to digital conversion process which minimizes the hardware requirements. A sigma-delta modulator is provided, having either a low pass or a bandpass response by selecting an appropriate error transfer function. A complex modulation and complex filtering system is disclosed to filter and decimate the high speed data sequence produced by the sigma-delta modulator.

While the foregoing system reduces the hardware complexity necessary to carry out these later stages of processing, it still requires modulating the high speed digital signal by four sine and cosine sequences to produce a baseband signal, and then individually filtering and decimating the resulting modulated signals. Accordingly, it is an object of this invention to further reduce the circuit complexity for filtering and decimating a high speed bit stream produced by a delta-sigma modulator.

SUMMARY OF THE INVENTION

In accordance with the invention, a decimation filter is provided for delta-sigma analog to digital converters. The decimation filter design includes a baseband conversion signal which is related to the modulator sampling frequency $F_s$. In order to reduce the circuit complexities for filtering and decimating the high speed digital signal, the system uses a sampling signal $F_s$ which is substantially $6F_c$ where $F_c$ is the carrier frequency of interest.

In selecting $F_s = 6F_c$, baseband conversion is provided by a complex modulator which is designed to multiply the high speed digital sequence by $SIN(\omega_0 nT)$ and $COS(\omega_0 nT)$ n=0, 1, 2, . . . ; $T=1/F_s$. By selecting the modulation frequency of $\omega_0 = \pi/3$, a sequence of modulating signals is provided for recovering a real and imaginary baseband signal comprising a very simple structure, wherein only two signal paths are needed for processing the real and imaginary components. Each of the real and imaginary components are further filtered to derive the decimated nyquist frequency signal.

DESCRIPTION OF THE PREFERRED EMBODIMENT

Figure 1:
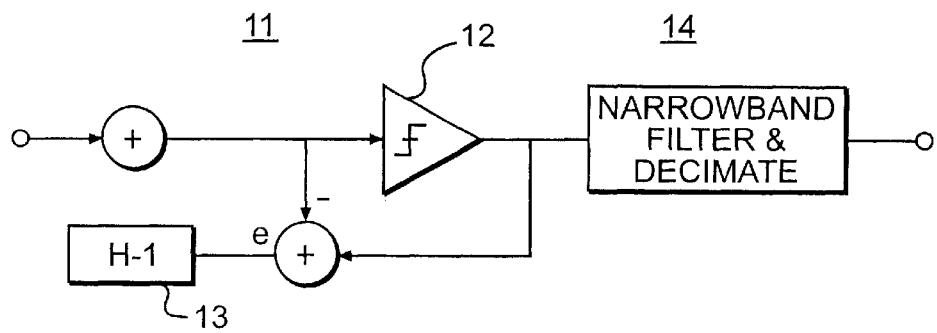
FIG. 1 illustrates the analog to digital converter utilizing the low pass filter and decimation circuit.

Referring now to FIG. 1, an analog digital converter using a sigma-delta modulator 11 with a filter and decimation circuit is shown. The sigma-delta modulator 11 receives a radio frequency signal which has been amplitude modulated with digital data. The sigma-delta modulator has a quantizer 12 which produces a quantized output signal which is derived from loop transfer function H 13. The sigma-delta modulator 11 effectively shapes the noise of the resultant signal in the bandwidth of interest BW, by oversampling the received analog signal having a center frequency of $F_c$. Since $F_s$ is the sampling frequency, the oversampling ratio OSR is selected to be at least twice the bandwidth BW of the signals to be recovered from the analog signal.

The sigma-delta modulator oversampled high speed bit stream is converted into a multi-bit digital nyquist signal. The digital bandpass filter and decimation circuit 14 decimates the input oversampled digital signal through a process of modulation and filtering.

Figure 2:
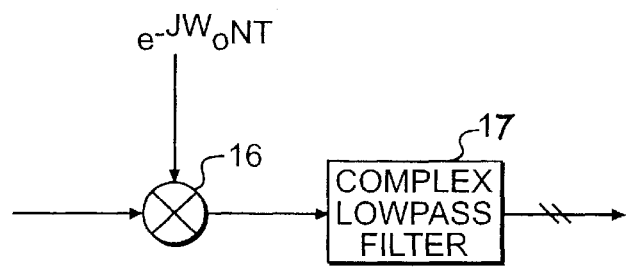
FIG. 2 illustrates the process of converting an oversampled bit sequence of analog data into a baseband signal.

The process of modulation and filtering is illustrated more completely in FIG. 2. The modulating signal $e^{-j\omega n T}$ can be represented by a pair of SIN and COS signals, $COS(\omega_0 nT)$, and $-SIN(\omega_0 nT)$. The modulating signals will produce a real and imaginary baseband component from the input high speed bit stream sequence. The modulating signal $e^{-j\omega_0 nT}$ multiplies the input oversampled high bit data stream derived by the sigma-delta modulator in multiplier 16 producing a baseband signal. The resulting baseband signal is filtered and decimated in filter circuit 17.

In accordance with one aspect of the invention, the modulating signal $e^{-j\omega_0 nT}$ may be selected so that the hardware implementation of the complex low pass filter is significantly reduced in complexity. By selecting an oversampling ratio N so that $F_c = F_s/6$, it is possible to select a demodulating signal $e^{j\omega_0 nT}$ so that $\omega_0$ is equal to $\pi/3$. The modulation signal having a $\#_0$ of $\pi/3$, produces first and second sequences of values according to the following:

$COS(\pi/3nT)=1, ½,-½,-1,-½,½ \ldots$ $SIN(\pi/3nT)=0,\sqrt{3/2}, \sqrt{3/2},0,-\sqrt{3/2},-\sqrt{3/2} \ldots$ The foregoing sequences have respectively terms ±1, ±½, and 0, $\sqrt{3/2}$. These sequences can be further rationalized as shown below so that whole integers are provided as follows:

$COS(\pi/3nT)=2,1,-1,-2,-1,1 \ldots X(1/2)$ $SIN(\pi/3nT)=0,1,1,0,-1,-1 \ldots X(3/2)$ By rationalizing each of the bit sequences of the multiplying signals, simplified hardware for deriving real and imaginary demodulated and decimated signals may be implemented. One such implementation is shown in FIG. 3.

Figure 3:
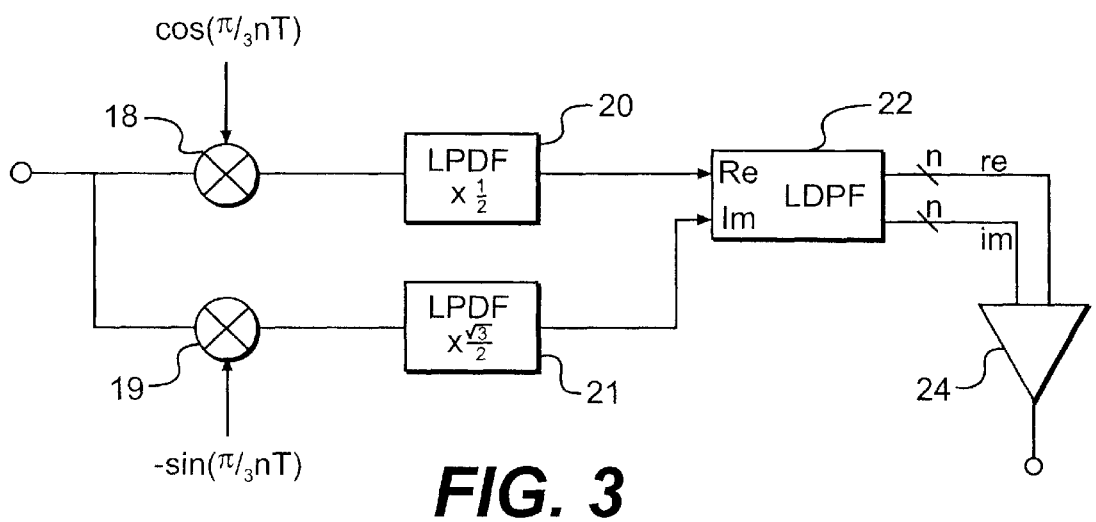
FIG. 3 illustrates the hardware implementation of the complex modulator and complex filter and decimation circuits used in accordance with the present invention.

Referring now to FIG. 3, the input digital signal having a sampling frequency $F_s$ related to carrier frequency $F_c$ are received from the delta-sigma modulator 11 on inputs of first and second multipliers 18 and 19. Multiplier 18 is also connected to a sequence of signals, representing COS($\pi$/3nT) having the foregoing sequence of 2, 1, −1, −2, −1, 1 ... Correspondingly, the imaginary portion of the input signal is recovered by multiplier 19 which receives the sequence 0, 1, 1, 0, −1, −1 corresponding to the SIN function SIN($\pi$/3nT). The processing of the real and imaginary signal only requires two signal paths with the requisite filter hardware. The frequency $\omega_0=\pi/3$ may be selected when the ratio N of $F_s/F_c$ equals 6.

The first low pass filter 20 is shown as a low pass filter having an output which is normalized by the factor ½ to restore the real component to its proper amplitude. Additionally, a similar low pass filter structure is shown 21 having an output normalized by $\sqrt{3/2}$ to derive the full imaginary component of the nyquist rate signal.

The first stage of filtering provides decimation to reduce the sampling rate while maintaining an adequate signal to noise ratio. The decimation filters 20, 21 also provides for rejection of out of band signals that are in the baseband. Post filtering is provided by low pass digital filter 22. The post-filtering may be accomplished with an FIR filter, as is known in conventional delta-sigma modulator analog to digital conversion schemes.

Further processing of the real and imaginary signal signals from the low pass digital filter 22 occurs by following circuit 24 to derive the received original signal. Depending on the modulation applied to the derived signal, the decimation filters phase response must either be linear, in the case of phase or frequency modulation, or in the case of amplitude modulation need not be considered.

The foregoing disclosure includes all the information deemed essential to enable those skilled in the art to practice the claimed invention. Because the cited applications may provide further useful information, these cited materials are hereby incorporated by reference in their entirety. The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A bandpass analog to digital converter comprising:
   a bandpass delta sigma modulator for converting a signal having a nominal frequency of $F_c$ to an oversampled digital signal of a bit rate of $F_s$, where $F_s=N*F_c$, N=6;
   a digital decimation filter for converting the signal from said delta sigma modulator to a multibit digital signal having a nyquist sampling rate of $F_s/N$ comprising:
      a first multiplier for multiplying said digital signal from said sigma delta modulator by COS($\pi*nT/3$) for producing a digital signal at a nyquist rate;
      a second multiplier for multiplying said digital signal from said sigma delta modulator by SIN($\pi*nT/3$) for producing a digital signal at a nyquist rate;
      first and second low pass filters connected to filter respective of said first and second signals from said first and second multipliers producing real and imaginary signals, and
      a third low pass filter to filter said real and imaginary signals from said first and second low pass filters.

2. The bandpass analog to digital converter according to claim 1 further comprising:
   a source of COS($\pi*nT/3$) signals connected to said first modulator, said source producing a series of digital signals having values of 1, ½, −½, −1; −½, ½ and
   a source of SIN($\pi*nT/3$) signals connected to said second modulator for producing a series of signals having values 0, $\sqrt{3/2}$, $\sqrt{3/2}$, 0, $-\sqrt{3/2}$ and $-\sqrt{2/3}$.

3. A bandpass analog to digital converter according to claim 2 wherein said source of COS signals normalizes said series of signals to 2, 1, −1, −2; −1, −1 and said source of SIN signals normalizes said series of sin signals to 0, 1, 1, 0, −1, −1.

4. The bandpass analog to digital converter according to claim 3 further comprising means for normalizing the output of said first and second low pass filters by ½ and $\sqrt{3/2}$ respectively.

5. A method for converting an analog radio frequency signal to a digital base band signal comprising:
   converting said analog signal to an over sampled digital signal using a delta sigma-modulator having a sampling rate of $F_s$ which is N times the radio frequency signal carrier frequency $F_c$, N=6;
   converting said over sampled digital signal to a nyquist sampling rate of $F_s/R$ where R is the over sampling ratio comprising the substeps of:
      multiplying said over sampled digital signal by a sin signal having a frequency of SIN($\pi/3nT$) having values proportional to 0, $-\sqrt{3/2}$, $\sqrt{3/2}$, 0, $-\sqrt{3/2}$; to form a first nyquist rate sampled base band signal;
      multiplying said over sampled digital signal by a cosine signal having a frequency of COS($\pi/3nT$) having values proportional to 1, ½, −½, −1, −½, ½ to form a second nyquist rate sampled base band signal;
      filtering said first and second nyquist rate signals in first and second low pass digital filters; and
      filtering signals from said first and second low pass filters in a complex digital filter to produce a real and imaginary digital signal.

6. The method for converting an analog radio frequency signal to a digital signal according to claim 5 further comprising: converting each of said cosine values and sine values to rational numbers before multiplying them with said digital signal.

7. The method for converting an analog radio frequency signal according to claim 6 further comprising amplitude correcting each signal from said first and second low pass filters.

8. The method for converting and analog radio frequency signal according to claim 7 wherein said signal from said first low pass filter is corrected by a factor of ½ and said signal from said second low pass filter is corrected by $\sqrt{3/2}$.

9. The method according to claim 5 wherein said sampling rate $F_s$ is six times the carrier frequency $F_c$.

10. In a system for converting analog radio frequency signals to digital signals, a method for converting said signals to baseband signals comprising:

sampling said analog radio frequency signals to digitals at a rate of $F_s$;

forming a first digital conversion signal having a function of $COS(\omega_0 nT)$ where $\omega_0$ is $\pi/3$; said digital conversion signal having an amplitude sequence of 1, ½, −½, and −1;

forming a second digital conversion signal having a function of $SIN((\omega_0*t)$ where $\omega_0$ is $\pi/3$; said digital conversion signal having the sequence of 0, $-\sqrt{3/2}$, $\sqrt{3/2}$, 0, $-\sqrt{3/2}$ and $-\sqrt{3/2}$;

multiplying said sampled radio frequency signals with said first and second signals to obtain a real and imaginary converted digital signals; and filtering and decimating said real and imaginary converted digital signals.

11. The method of converting digital radio frequency signals to baseband digital signals according to claim 10 further comprising:

rationalizing said first and second conversion signals prior to multiplying said sampled radio frequency signals with said conversion signals; and amplitude normalizing said real and imaginary signals prior to filtering said real and imaginary signals.

12. The method according to claim 11 wherein said step of filtering said real and imaginary signals includes filtering said signals using an FIR digital filter.

* * * * *